United States Patent
Bauer

(10) Patent No.: US 6,671,202 B1
(45) Date of Patent: Dec. 30, 2003

(54) PROGRAMMABLE CIRCUIT STRUCTURES WITH REDUCED SUSCEPTIBILITY TO SINGLE EVENT UPSETS

(75) Inventor: Trevor J. Bauer, Boulder, CO (US)

(73) Assignee: Xilinx, Inc., San Jose, CA (US)

(*) Notice: Subject to any disclaimer, the term of this patent is extended or adjusted under 35 U.S.C. 154(b) by 41 days.

(21) Appl. No.: 10/172,835

(22) Filed: Jun. 13, 2002

(51) Int. Cl.$^7$ .............................................. H01L 25/00
(52) U.S. Cl. .................. 365/154; 365/230.02; 326/112; 326/113
(58) Field of Search ............................ 365/154, 230.02; 326/112, 113, 41

(56) References Cited

U.S. PATENT DOCUMENTS 5,760,604 A * 6/1998 Pierce et al. .................. 326/41
6,278,290 B1 * 8/2001 Young .......................... 326/41
6,363,019 B1 * 3/2002 Erickson et al. ....... 365/189.07

\* cited by examiner

*Primary Examiner*—Vu A. Le
(74) *Attorney, Agent, or Firm*—Lois D. Cartier

(57) ABSTRACT

Programmable circuit structures having reduced susceptibility to single event upsets. A circuit structure includes a programmable circuit controlled by a group of memory cells, of which at most one has an enable value. The memory cells are coupled together such that if any one memory cell in the group is at the enable value, then all other memory cells in the group are forced to a disable value. If a single event upset occurs at any of the disabling memory cells the value in the memory cell does not change, because the memory cell is being held disabling by the one enabling memory cell. However, if a single event upset occurs at the enabling memory cell, causing it to become disabling, a circuit error occurs. Thus, the susceptibility of the circuit structure has been reduced by a factor of $(N-1)/N$, where $N$ is the number of memory cells.

32 Claims, 4 Drawing Sheets

PROGRAMMABLE CIRCUIT STRUCTURES WITH REDUCED SUSCEPTIBILITY TO SINGLE EVENT UPSETS

FIELD OF THE INVENTION

The invention relates to circuit structures susceptible to single event upsets, such as those in programmable logic devices (PLDs). More particularly, the invention relates to programmable circuit structures on which single event upsets have a reduced impact.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAM, and so forth).

The various logic blocks are interconnected by a programmable interconnect structure that includes a large number of programmable interconnect lines (e.g., metal wires). The interconnect lines and logic blocks are interconnected using programmable interconnect points (PIPs). A PIP can be, for example, a pass gate. When the pass gate is turned on, the two nodes on either side of the pass gate are electrically connected. When the pass gate is turned off, the two nodes are isolated from each other. Thus, by controlling the values on the gate terminals of the pass gates, circuit connections can easily be made and altered.

The logic blocks and PIPs in a PLD are typically programmed (configured) by loading configuration data into thousands of configuration memory cells. In Field Programmable Gate Arrays (FPGAs), for example, each configuration memory cell is implemented as a static RAM cell. These static RAM cells are used, for example, to control the gate terminals of pass gates between pairs of interconnect lines.

When subjected to unusual conditions such as cosmic rays or bombardment by neutrons or alpha particles, a static RAM cell can change state. For example, a stored high value can be inadvertently changed to a low value, and vice versa. Sometimes these "single event upsets" have no effect on the functionality of the chip, for example, when the static RAM cell controls a pass gate between two unused interconnect lines. At other times, a single event upset can change the functionality of a configured PLD such that the circuit no longer functions properly.

FIG. 1 shows an exemplary programmable circuit that is subject to the effects of single event upsets. The circuit of FIG. 1 is a programmable multiplexer circuit that includes several pass gates. This type of circuit is commonly included in FPGA interconnect structures, for example. The circuit selects one of several different input signals and passes the selected signal to an output node.

The circuit of FIG. 1 includes 16 input terminals IN0–IN15 and 20 pass gates 100–115, 120–123 that selectively pass one of signals IN0–IN15, respectively, to an internal node INT. (In the present specification, the same reference characters are used to refer to terminals, signal lines, and their corresponding signals.) The signal on internal node INT is buffered by buffer BUF to provide output signal OUT.

Buffer BUF, for example, can include two inverters 131, 132 coupled in series, and a pull up (e.g., a P-channel transistor 133 to power high VDD) on internal node INT and driven by the node between the two inverters. However, buffer BUF can be implemented in many different ways.

Each pass gate 100–115 has a gate terminal driven by one of memory cells M4–M7. Each pass gate 120–123 has a gate terminal driven by one of memory cells M0–M3, respectively. Each memory cell can include two cross-coupled inverters An, Bn, for example. Memory cells M0–M7 can be implemented in many different ways. However, aside from shared configuration logic (i.e., logic for loading and sometimes reading back the contents of the memory cell), memory cells M0–M7 operate independently of each other.

The programmable multiplexer circuit of FIG. 1 operates as shown in Table 1. At most, one of memory cells M4–M7 and one of memory cells M0–M3 can be configured with a high value at any given time. Other configurations are not supported by the circuit. As can be seen from Table 1 and FIG. 1, the one of memory cells M4–M7 with a high value selects four input signals to be passed to internal nodes INT0–INT3. The one of memory cells M0–M3 with a high value then selects one of the signals on nodes INT0–INT3 to be passed to node INT, and hence to output node OUT. If none of memory cells M0–M7 is configured with a high value, output signal OUT is held at its initial high value by pullup 133.

TABLE 1

| M7 | M6 | M5 | M4 | M3 | M2 | M1 | M0 | OUT |
|----|----|----|----|----|----|----|----|-----|
| 0 | 0 | 0 | 0 | 0 | 0 | 0 | 0 | High |
| 0 | 0 | 0 | 1 | 0 | 0 | 0 | 1 | IN0 |
| 0 | 0 | 1 | 0 | 0 | 0 | 0 | 1 | IN1 |
| 0 | 1 | 0 | 0 | 0 | 0 | 0 | 1 | IN2 |
| 1 | 0 | 0 | 0 | 0 | 0 | 0 | 1 | IN3 |
| 0 | 0 | 0 | 1 | 0 | 0 | 1 | 0 | IN4 |
| 0 | 0 | 1 | 0 | 0 | 0 | 1 | 0 | IN5 |
| 0 | 1 | 0 | 0 | 0 | 0 | 1 | 0 | IN6 |
| 1 | 0 | 0 | 0 | 0 | 0 | 1 | 0 | IN7 |
| 0 | 0 | 0 | 1 | 0 | 1 | 0 | 0 | IN8 |
| 0 | 0 | 1 | 0 | 0 | 1 | 0 | 0 | IN9 |
| 0 | 1 | 0 | 0 | 0 | 1 | 0 | 0 | IN10 |
| 1 | 0 | 0 | 0 | 0 | 1 | 0 | 0 | IN11 |
| 0 | 0 | 0 | 1 | 1 | 0 | 0 | 0 | IN12 |
| 0 | 0 | 1 | 0 | 1 | 0 | 0 | 0 | IN13 |
| 0 | 1 | 0 | 0 | 1 | 0 | 0 | 0 | IN14 |
| 1 | 0 | 0 | 0 | 1 | 0 | 0 | 0 | IN15 |

In the multiplexer circuit of FIG. 1, the upset of any single memory cell (i.e., any single event upset affecting any of memory cells M0–M7) causes a failure in the circuit. For example, assume that memory cells M4 and M0 store high values, while memory cells M1–M3, M5–M7 store low values. The selected input signal is IN0. Pass gates 112, 108, 104, 100, 120 are enabled, and all other illustrated pass gates are disabled. If the value in memory cell M7 is upset (i.e., changes to a high value), pass gate 103 is enabled and there is a "short" (an inadvertent coupling) between input terminals IN0 and IN3. Similarly, if the value in memory cell M2 is upset, pass gate 122 is enabled and there is a short between nodes IN0 and IN8, and so forth. If the value in either of memory cells M4 and M0 is upset (i.e., changes to a low value), the path from input terminal IN0 to output terminal OUT is broken, and output signal OUT is no longer actively driven by node IN0.

Thus, the multiplexer circuit of FIG. 1 is one example of a programmable circuit that is susceptible to single event upsets.

In general, larger circuits that include more memory cells are more susceptible to single event upsets than smaller circuits with fewer memory cells. For example, a configurable logic block (CLB) in an FPGA can include several hundred memory cells. A single event upset in any one of these memory cells can cause an error in a user circuit implemented in the CLB. PLDs and logic blocks are growing progressively larger and more complicated over time, and the number of memory cells included in PLDs is increasing as a result.

Further, as operating voltages diminish, static RAM cells become more susceptible to changes in state caused by single event upsets. To reduce manufacturing costs, PLD manufacturers are aggressively reducing device sizes in their PLDS. These smaller devices often operate at lower voltages.

Therefore, the effects of single event upsets are becoming more important over time. Hence, it is desirable to provide PLD circuits with reduced susceptibility to single event upsets.

SUMMARY OF THE INVENTION

The invention provides circuit structures for programmable logic devices (PLDS) that have reduced susceptibility to single event upsets. A circuit structure according to the invention includes a programmable circuit controlled by memory cells. The programmable circuit is designed such that at most one of the memory cells in a group of the memory cells has an enable value at any given time. According to the invention, the memory cells are coupled together such that if any one memory cell in the group is at an enable value (e.g., high), then all other memory cells in the same group are forced to a disable value (e.g., low).

If a single event upset occurs at any of the memory cells that are configured to provide disable values ("disabling memory cells"), the value in the memory cell does not change, because the memory cell is being held disabling by the one enabling memory cell in the group. However, if a single event upset occurs at the enabling memory cell, causing it to become disabling, a circuit error does occur. Thus, the susceptibility of the circuit structure has been reduced by a factor of (N−1)/N (N minus 1 divided by N), where N is the number of memory cells in the group.

According to a first embodiment of the invention, a circuit structure having reduced susceptibility to single event upsets includes a programmable circuit and a group of memory cells coupled to control terminals of the programmable circuit. Of the control terminals, at most one provides an enable value at any given time. Each memory cell also drives an initialization input terminal of each other memory cell in the group of memory cells.

In some embodiments, the enable signal is an active high enable signal, and the initialization input terminal of each memory cell is a reset terminal that forces a value stored in the memory cell to a low disable value. In other embodiments, the enable signal is an active low enable signal, and the initialization input terminal of each memory cell is a set terminal that forces a value stored in the memory cell to a high disable value.

In some embodiments, the programmable circuit is a multiplexer circuit that can include a plurality of pass gates. In one embodiment, the pass gates are N-channel transistors.

One embodiment includes a second group of memory cells, which are coupled to additional control terminals of the programmable circuit. Of these additional control terminals, at most one provides an enable value at any given time. Each memory cell in the second group drives an initialization input terminal of each other memory cell in the second group of memory cells.

According to a second embodiment of the invention, a circuit structure having reduced susceptibility to single event upsets includes a plurality of nodes, a plurality of pass gates programmably coupling the nodes together, and a plurality of memory cells coupled to control terminals of the pass gates. Of the control terminals, at most one provides an enable value at any given time. Each memory cell drives an initialization input terminal of each other memory cell in the plurality of memory cells.

According to a third embodiment of the invention, a system having reduced susceptibility to single event upsets includes a plurality of programmable logic circuits, a plurality of interconnect lines programmably coupling the programmable logic circuits to each other, and a group of memory cells coupled to control terminals of at least one of the programmable circuits. Of the control terminals, at most one provides an enable value at any given time. Each memory cell drives an initialization input terminal of each other memory cell in the group of memory cells.

In some embodiments, the system is a programmable logic device (PLD). In some of these embodiments, the PLD is a field programmable gate array (FPGA) and the programmable circuit controlled by the group of memory cells includes a configurable logic block (CLB).

According to a fourth embodiment of the invention, a system having reduced susceptibility to single event upsets includes a plurality of programmable logic circuits, an interconnect structure that includes a plurality of interconnect circuits, the interconnect structure programmably coupling the programmable logic circuits to each other, and a group of memory cells coupled to control terminals of at least one of the interconnect circuits. Of the control terminals, at most one provides an enable value at any given time. Each memory cell drives an initialization input terminal of each other memory cell in the group of memory cells.

BRIEF DESCRIPTION OF THE DRAWINGS

The present invention is illustrated by way of example, and not by way of limitation, in the following figures.

DETAILED DESCRIPTION OF THE DRAWINGS

Figure 2:
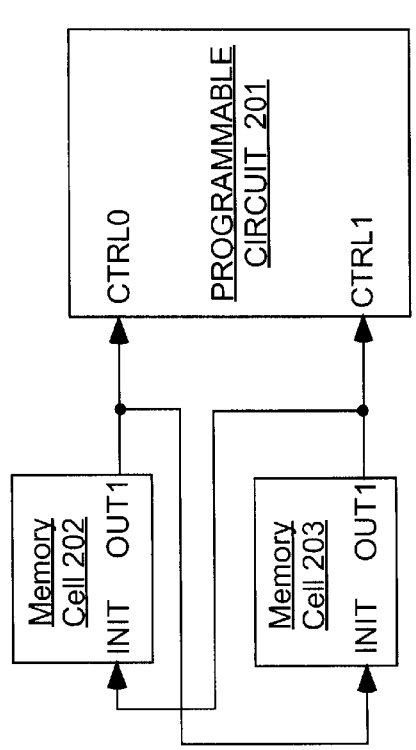
FIG. 2 shows a first programmable circuit structure according to a first embodiment of the invention.

FIG. 2 shows an exemplary circuit structure with reduced susceptibility to single event upsets according to a first embodiment of the invention. The circuit structure of FIG. 2 includes a programmable circuit 201 with two control input terminals CTRL0, CTRL1. Of these two control terminals, only one can provide an enable control signal at any given time. Embodiments having the additional control terminals can include groups of two or more control terminals, but only one control terminal in each group can provide an enable control signal at any given time.

Also included in the circuit structure of FIG. 2 are two memory cells 202, 203. Each memory cell includes an output terminal OUT1, whereby an enable or disable signal is provided to an associated control terminal of programmable circuit 201. Each memory cell also includes an initialization input terminal INIT, whereby the contents of the memory cell are set to the disable value. Each memory cell output terminal OUT1 drives the initialization input terminal INIT of the other memory cell. In embodiments having additional memory cells, each memory cell drives an additional control terminal of programmable circuit 201, and each memory cell also drives an initialization input terminal of each other memory cell in the same group.

In some embodiments, the enable value is a high value and the disable value is a low value. When the enable value is a high value, the initialization input terminals are reset terminals that force the output of the corresponding memory cells to a low value. When the enable value is a low value, the initialization input terminals are set terminals that force the output of the corresponding memory cells to a high value.

Therefore, when one of the memory cells stores an enable value, that memory cell initializes the other memory cells in the group to a disable value. This initialization overrides any attempted upset by a single event upset. Therefore, only the one enabling memory cell remains at an enable value. Single event upsets to the other disabling memory cells are prevented. However, single event upsets at the enabling memory cell do cause a circuit error. Thus, the susceptibility of the circuit structure has been reduced by a factor of $(N-1)/N$ (N minus 1 divided by N), where N is the number of memory cells in the group.

In some embodiments, the circuit structure of FIG. 2 is part of a PLD, and the memory cells are configuration memory cells for the PLD.

Figure 3:
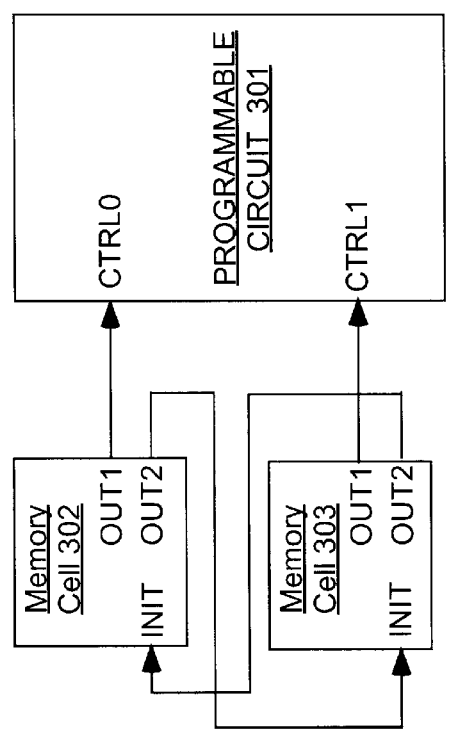
FIG. 3 shows a second programmable circuit structure according to a second embodiment of the invention.

FIG. 3 shows an exemplary circuit structure with reduced susceptibility to single event upsets according to a second embodiment of the invention. The circuit structure of FIG. 3 is similar to that of FIG. 2, except that the memory cells 301, 302 each have two output signals OUT1, OUT2, one of which drives a corresponding control input signal of programmable circuit 301, and one of which drives the initialization input terminal of the other memory cell.

Figure 4:
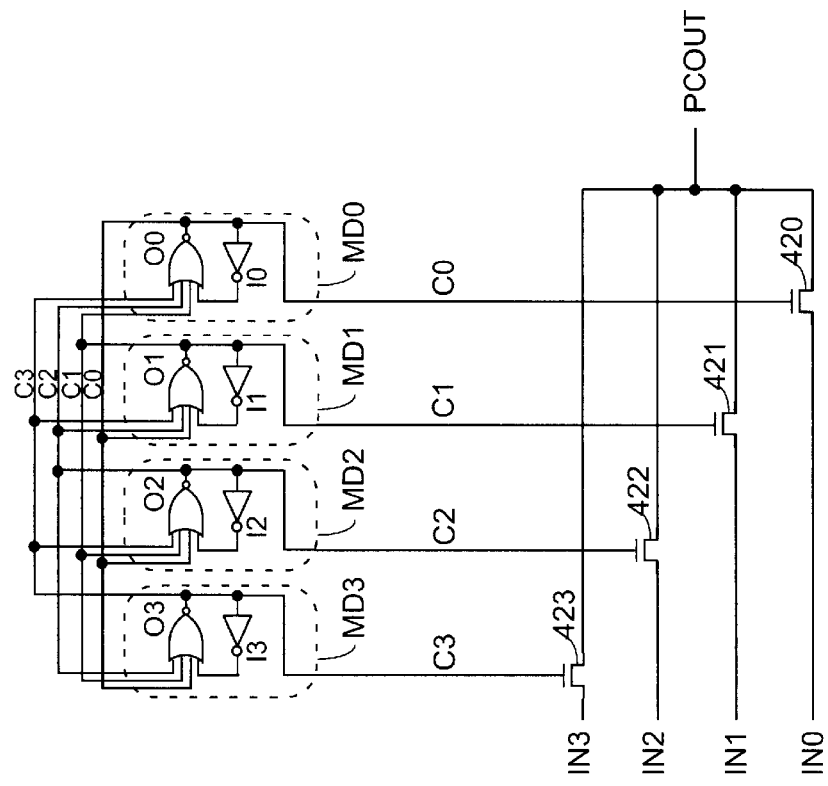
FIG. 4 shows a programmable multiplexer circuit according to a third embodiment of the invention.

FIG. 4 shows a programmable multiplexer structure according to a third embodiment of the invention. The multiplexer structure of FIG. 4 is one embodiment of the circuit structure of FIG. 2.

The circuit of FIG. 4 includes four input terminals IN0–IN3 and four pass gates 420–423 that selectively pass one of signals IN0–IN3, respectively, to an output terminal PCOUT. Each pass gate 420–423 has a gate terminal driven by one of memory cells MD0–MD3, respectively, via control signals C0–C3.

In the pictured embodiment, the pass gates are implemented as N-channel transistors. Therefore, the enable value is a high value. In other embodiments, CMOS pass gates are used, and the enable value includes both a high value provided to an N-channel transistor and a low value provided to a corresponding P-channel transistor. In yet other embodiments, other types of pass gates are used.

In the pictured embodiment, each memory cell MD0–MD3 includes an inverter I0–I3 and a NOR gate O0–O3, respectively. The NOR gates O0–O3 drive their associated inverters I0–I3, provide the control signals C0–C3 to pass gates 420–423, and also provide the control signals C0–C3 as initialization signals to the other three memory cells. Each inverter I0–I3 drives one input terminal of the associated NOR gate O0–O3, respectively. The other three input terminals of each NOR gate are driven by the initialization signals from the other three memory cells.

The memory cells of FIG. 4 operate as in the following example. Suppose that memory cell MD0 stores a high (enabling) value, and memory cells MD1–MD3 store low (disabling) values. If a single event upset occurs in memory cell MD3, for example, signal C0 (which is high) operates on NOR gate O3 to hold signal C3 low. The value stored in memory cell MD3 does not change, and the single event upset in memory cell MD3 is prevented.

Thus, in the multiplexer circuit of FIG. 4, single event upsets in the three disabling memory cells are prevented. However, a single event upset in the one enabling memory cell still is not prevented. Thus, the susceptibility of the circuit structure to single event upsets is reduced by a factor of ¾ (75 percent) from a prior art 4-to-1 multiplexer.

Figure 5:
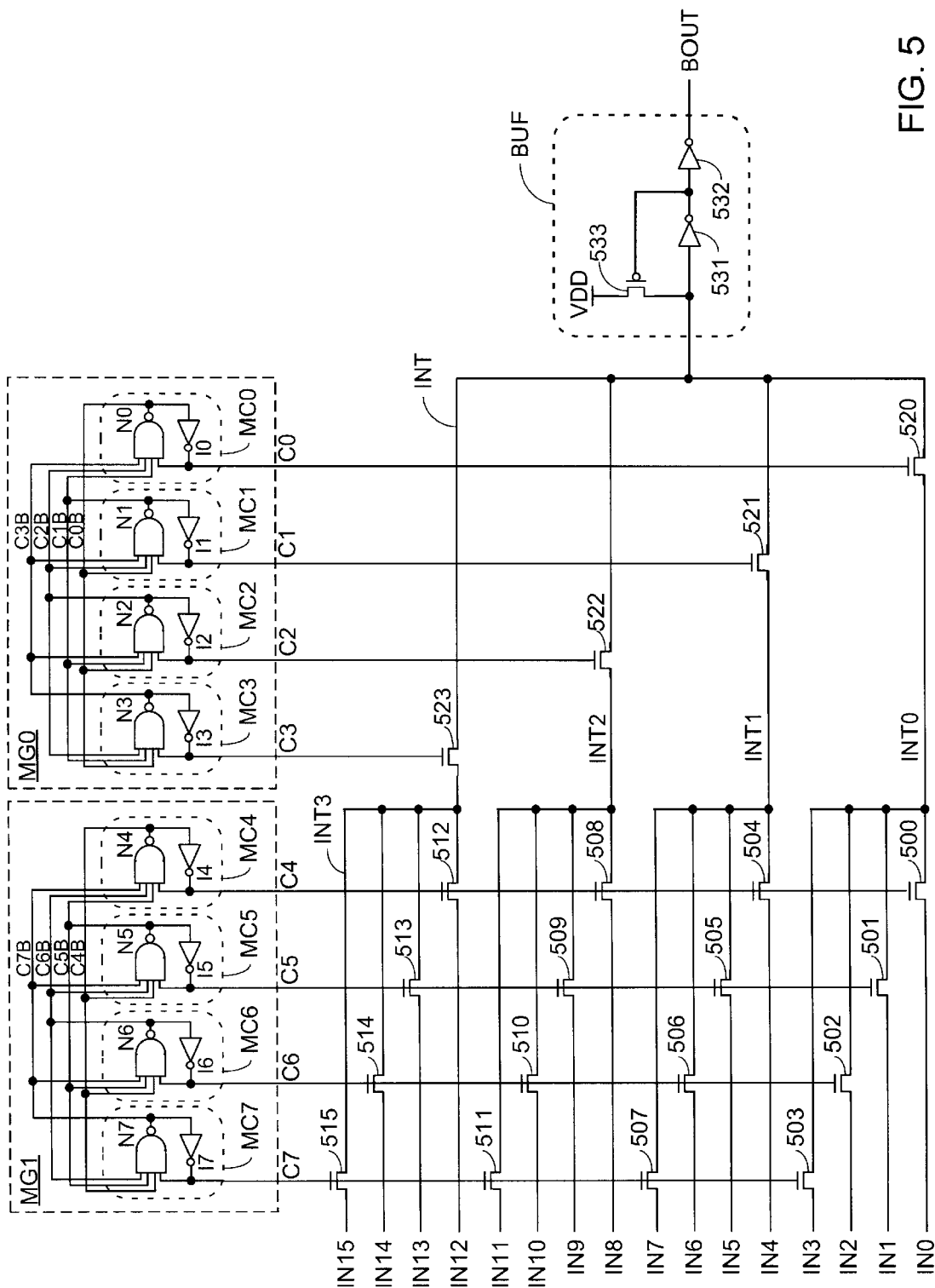
FIG. 5 shows a programmable multiplexer circuit according to a fourth embodiment of the invention.

FIG. 5 shows a programmable multiplexer structure according to a fourth embodiment of the invention. The multiplexer structure of FIG. 5 is one embodiment of the circuit structure of FIG. 3. However, note that the circuit structure of FIG. 5 includes two distinct groups of memory cells, group MG0 (containing memory cells MC0–MC3) and group MG1 (containing memory cells MC4–MC7). Within each group, only one memory cell can provide an enabling value.

Figure 1:
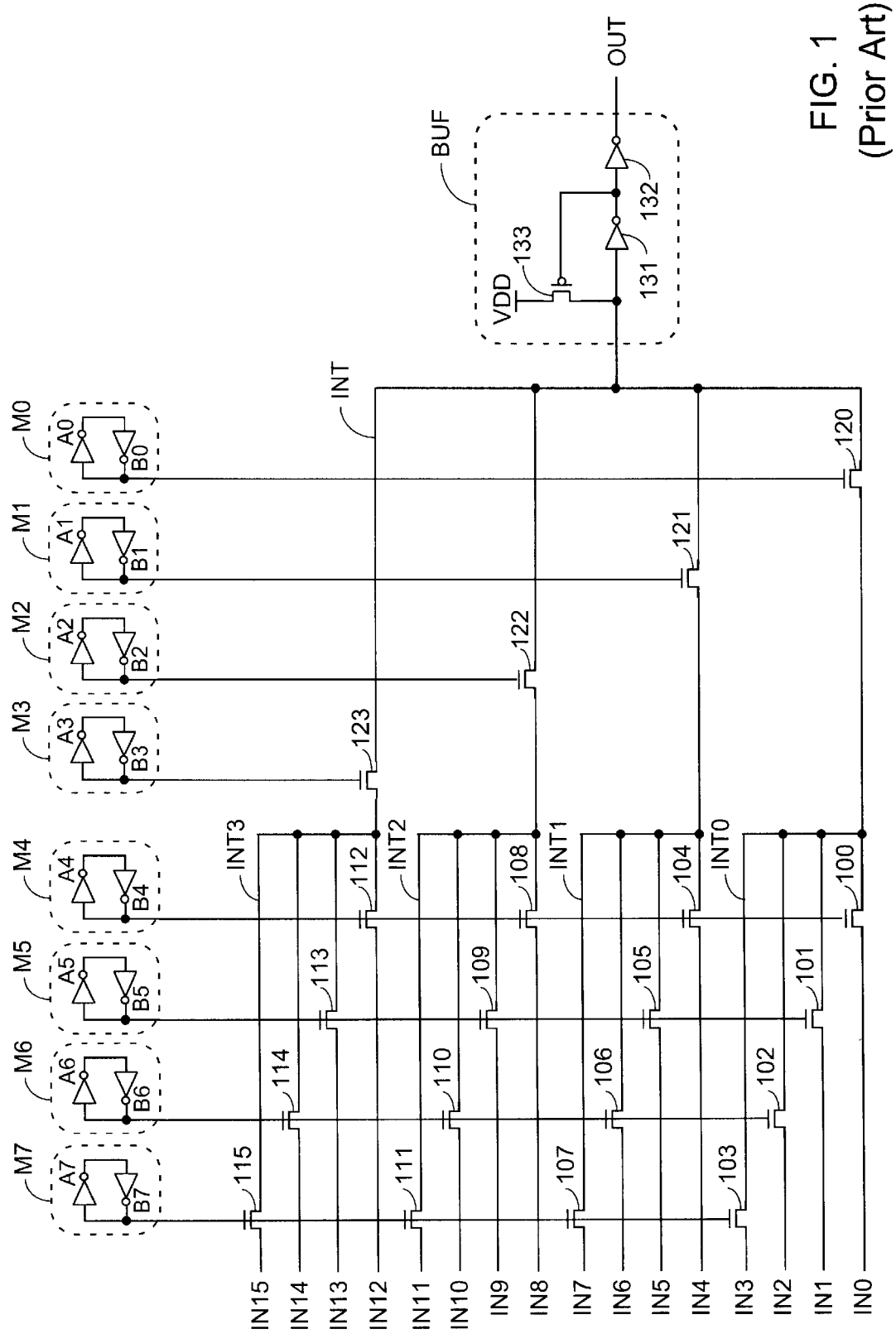
FIG. 1 shows a prior art programmable multiplexer circuit.

Note that the multiplexer circuit of FIG. 5 has the same truth table as the prior art multiplexer circuit of FIG. 1 and Table 1. The two multiplexer circuits have similar structures as well, except for memory cell groups MG0, MG1. Therefore, only the memory cell groups are described here.

In the embodiment of FIG. 5, the pass gates are implemented as N-channel transistors. Therefore, the enable value is a high value. In other embodiments, CMOS pass gates or other pass gate implementations are used, as described above with reference to FIG. 4.

In the pictured embodiment, each memory cell MC0–MC7 includes an inverter I0–I7 and a NAND gate N0–N7, respectively. The NAND gates N0–N7 drive their associated inverters I0–I7 and provide the initialization signals C0B–C7B to the other three memory cells in the same group. Each inverter I0–I7 drives one input terminal of the associated NAND gate N0–N7 and provides a control signal C0–C7, respectively, to one or more associated pass gates. The other three input terminals of each NAND gate are driven by the initialization signals from the other three memory cells in the same group.

Each memory cell group MG0, MG1 operates as in the following example. Suppose that memory cell MC0 stores a high (enabling) value, and memory cells MC1–MC3 store low (disabling) values. If a single event upset occurs in memory cell MC3, for example, signal C0B (which is low) operates on NAND gate N3 to hold signal C3B high. Inverter I3, which is driven by signal C3B, continues to provide a low (disabling) value. The value stored in memory cell MC3 does not change, and the single event upset in memory cell MC3 is prevented.

Thus, in each of memory cell groups MG0, MG1 single event upsets in the three disabling memory cells are prevented. However, a single event upset in the one enabling memory cell still is not prevented. Thus, the susceptibility of each memory cell group to single event upsets is reduced by a factor of ¾ (75 percent) from a prior art 4-to-1 multiplexer. The overall susceptibility of the entire circuit structure shown in FIG. 5 is also reduced by a factor of 75 percent, because single event upsets are prevented in six of eight memory cells.

In some embodiments, the multiplexer circuit of FIG. 5 is part of a PLD, and the memory cells are configuration memory cells for the PLD. In some such embodiments, care must be taken if the programmable circuit is to be reconfigured without powering down the PLD. For example, assume the multiplexer circuit of FIG. 5 is first configured to enable pass gates 520 and 500, i.e., input signal IN0 is selected. To reconfigure the multiplexer circuit to select input signal IN15 instead of input signal IN0, memory cells MC0 and MC4 must be reconfigured to a disable value before reconfiguring memory cells MC3 and MC7 to an enable value. Otherwise, the enable values in memory cells MC0 and MC4 will hold memory cells MC3 and MC7 at the disable value and prevent their reconfiguration.

The embodiments of FIGS. 4 and 5 are each constructed from one or more 4-to-1 multiplexers, i.e., the groups of memory cells each include four memory cells. However, the concepts of the invention can be incorporated into multiplexer structures of different sizes, and memory cell groups that include different numbers of memory cells. For larger multiplexers, the memory cells must be designed to accommodate a larger number of initialization input signals. Such modifications will be readily apparent to those of skill in the relevant arts.

Further, while multiplexer circuits are used herein to provide specific examples of how the concepts of the invention can be applied to programmable circuits, the invention is not limited to multiplexer circuits. Rather, the concepts of the invention can be applied to any programmable circuit controlled by memory cells, where within some subset of at least two memory cells only one of the memory cells can have an enable value at any given time.

Figure 6:
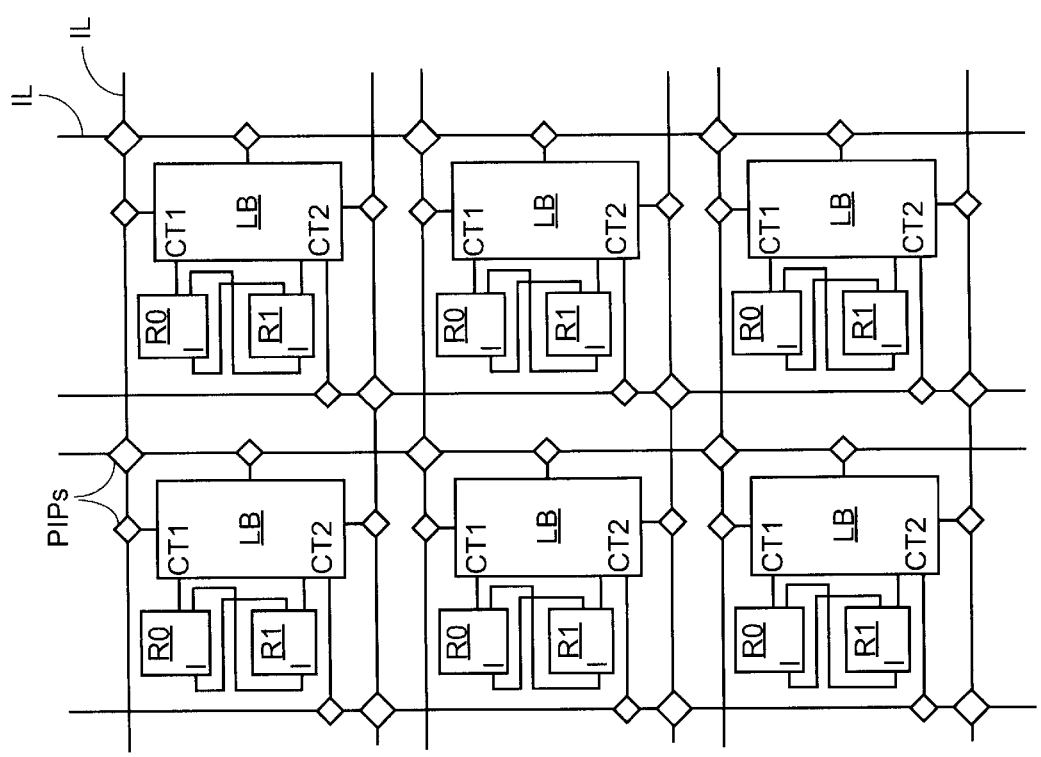
FIG. 6 shows a first system according to a fifth embodiment of the invention.

FIG. 6 shows a first system that includes a programmable circuit controlled by memory cells. The system of FIG. 6 includes an array of programmable logic circuits LB, interconnect lines IL that programmably connect the logic blocks LB to each other, and memory cells R0, R1 that supply control signals to the logic blocks. In the pictured embodiment, the interconnect lines and programmable logic circuits are also interconnected using programmable interconnect points (PIPs).

In one embodiment, the system is a PLD. In one embodiment, the PLD is an FPGA and the programmable logic circuits LB are CLBs.

As shown in FIG. 6, each programmable logic circuit LB has two control input terminals CT1, CT2 driven by memory cells R0, R1, respectively. Only one of the control input terminals CT1, CT2 can provide an enable input value to a given programmable logic circuit at any one time. Each of memory cells R0, R1 also drives an initialization input terminal of the associated memory cell R1, R0 of the same programmable logic circuit.

Figure 7:
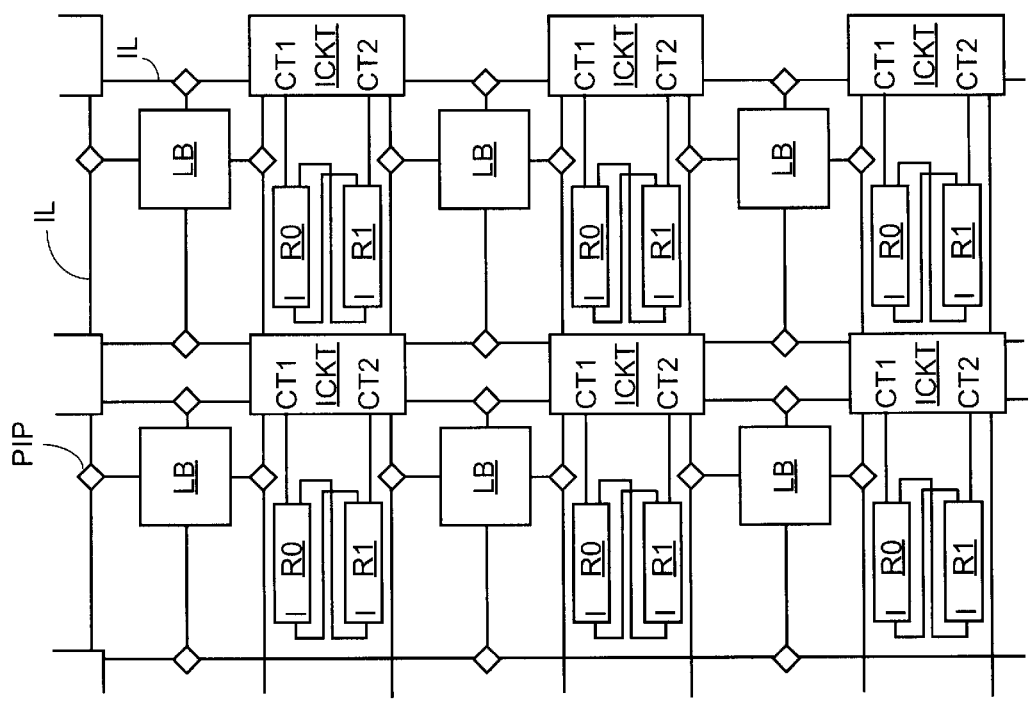
FIG. 7 shows a second system according to a sixth embodiment of the invention.

FIG. 7 shows a second system that includes an interconnect circuit controlled by memory cells. The system of FIG. 7 includes an array of programmable logic circuits LB, an interconnect structure that includes an array of interconnect circuits ICKT, and memory cells R0, R1 that supply control signals to each interconnect circuit ICKT. In the pictured embodiment, the interconnect structure and programmable logic circuits are also interconnected using programmable interconnect points (PIPs). In some embodiments, the PIPs are also implemented in a fashion similar to that shown for interconnect circuits ICKT.

In one embodiment, the system is a PLD. In one embodiment, the PLD is an FPGA.

As shown in FIG. 7, each interconnect circuit ICKT has two control input terminals CT1, CT2 driven by memory cells R0, R1, respectively. Only one of the control input terminals CT1, CT2 can provide an enable input value to a given interconnect circuit at any one time. As shown in FIG. 7, each of memory cells R0, R1 also drives an initialization input terminal of the associated memory cell R1, R0 of the same interconnect circuit.

Those having skill in the relevant arts of the invention will now perceive various modifications and additions that can be made as a result of the disclosure herein. For example, the above text describes the circuits of the invention in the context of field programmable gate arrays (FPGAs) controlled by configuration data stored in static RAM cells. However, the circuits of the invention can also be implemented in other programmable logic devices (PLDs) and other programmable systems subject to the effects of single event upsets or other kinds of failures.

Further, pass gates, transistors, N-channel transistors, P-channel transistors, pull ups, buffers, memory cells, NAND gates, NOR gates, multiplexer circuits, and other components other than those described herein can be used to implement the circuits of the invention. Active-high signals can be replaced with active-low signals by making straightforward alterations to the circuitry, such as are well known in the art of circuit design. For example, pass gates can be implemented as CMOS pass gates including paired N- and P-channel transistors enabled by a single memory cell. Moreover, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A circuit structure having reduced susceptibility to single event upsets, comprising:
    a programmable circuit having a plurality of control terminals, wherein at most one control terminal provides an enable value at any given time; and
    a first group of two or more memory cells, each memory cell having at least one initialization input terminal and further having an output terminal coupled to a control terminal of the programmable circuit, each memory cell in the first group driving an initialization input terminal of each other memory cell in the first group.

2. The circuit structure of claim 1, wherein for each memory cell in the first group of memory cells:
    the output terminal of the memory cell is an enable terminal having an active high enable value; and
    the initialization input terminal of the memory cell is a reset terminal that forces a value stored in the memory cell to a low disable value.

3. The circuit structure of claim 2, wherein each memory cell in the first group comprises:
    an inverter having an output terminal coupled to the output terminal of the memory cell and further having an input terminal;
    a NAND gate having an output terminal coupled to the input terminal of the inverter and further coupled to the reset terminals of the other memory cells in the first group, the NAND gate further having a first input terminal coupled to the output terminal of the inverter and a second input terminal coupled to the reset terminal of the memory cell.

4. The circuit structure of claim 2, wherein each memory cell in the first group comprises:
an inverter having an input terminal and an output terminal; and
a NOR gate having an output terminal coupled to the input terminal of the inverter and to the output terminal of the memory cell, and further coupled to the reset terminals of the other memory cells in the first group, the NOR gate further having a first input terminal coupled to the output terminal of the inverter and a second input terminal coupled to the reset terminal of the memory cell.

5. The circuit structure of claim 1, wherein for each memory cell in the first group of memory cells:
the output terminal of the memory cell is an enable terminal having an active low enable value; and
the initialization input terminal of the memory cell is a set terminal that forces a value stored in the memory cell to a high disable value.

6. The circuit structure of claim 1, wherein the programmable circuit comprises a multiplexer circuit.

7. The circuit structure of claim 6, wherein the multiplexer circuit comprises:
a plurality of MUX input terminals;
a MUX output terminal; and
a plurality of pass gates each coupled between one of the MUX input terminals and the MUX output terminal, each pass gate having a gate terminal coupled to one of the memory cells in the first group of memory cells.

8. The circuit structure of claim 7, wherein the pass gates comprise N-channel transistors.

9. The circuit structure of claim 6, wherein the multiplexer circuit comprises a 4-to-1 multiplexer circuit.

10. The circuit structure of claim 6, wherein the multiplexer circuit comprises a 16-to-1 multiplexer circuit.

11. The circuit structure of claim 1, wherein the programmable circuit further has a plurality of additional control terminals wherein at most one additional control terminal provides an enable value at any given time, the circuit structure further comprising:
a second group of two or more memory cells, each memory cell in the second group having at least one initialization input terminal and further having an output terminal coupled to one of the additional control terminals of the programmable circuit, each memory cell in the second group driving an initialization input terminal of each other memory cell in the second group.

12. A circuit structure having reduced susceptibility to single event upsets, comprising:
a plurality of nodes;
a plurality of pass gates programmably coupling the nodes together, each pass gate having a control terminal, of which at most one control terminal provides an enable value at any given time; and
a plurality of memory cells, each memory cell having at least one initialization input terminal and further having an output terminal coupled to the control terminal of at least one of the pass gates, each memory cell driving an initialization input terminal of each other memory cell in the plurality of memory cells.

13. The circuit structure of claim 12, wherein:
each pass gate is enabled by a high value on the control terminal;
the output terminal of each memory cell is an enable terminal having an active high enable value; and
the initialization input terminal of each memory cell is a reset terminal that forces a value stored in the memory cell to a low disable value.

14. The circuit structure of claim 13, wherein each memory cell comprises:
an inverter having an output terminal coupled to the output terminal of the memory cell and further having an input terminal; and
a NAND gate having an output terminal coupled to the input terminal of the inverter and further coupled to the reset terminals of the other memory cells, the NAND gate further having a first input terminal coupled to the output terminal of the inverter and a second input terminal coupled to the reset terminal of the memory cell.

15. The circuit structure of claim 13, wherein each memory cell comprises:
an inverter having an input terminal and an output terminal; and
a NOR gate having an output terminal coupled to the input terminal of the inverter and to the output terminal of the memory cell, and further coupled to the reset terminals of the other memory cells, the NOR gate further having a first input terminal coupled to the output terminal of the inverter and a second input terminal coupled to the reset terminal of the memory cell.

16. The circuit structure of claim 13, wherein the pass gates comprise N-channel transistors.

17. The circuit structure of claim 12, wherein:
each pass gate is enabled by a low value on the control terminal;
the output terminal of the memory cell is an enable terminal having an active low enable value; and
the initialization input terminal of the memory cell is a set terminal that forces a value stored in the memory cell to a high disable value.

18. The circuit structure of claim 12, wherein the plurality of nodes and the plurality of pass gates are configured to implement a multiplexer circuit.

19. The circuit structure of claim 18, wherein the multiplexer circuit comprises a 4-to-1 multiplexer circuit.

20. The circuit structure of claim 18, wherein the multiplexer circuit comprises a 16-to-1 multiplexer circuit.

21. A system having reduced susceptibility to single event upsets, the system comprising:
a plurality of programmable logic circuits, at least one of the programmable logic circuits having a plurality of control terminals, wherein at most one of the control terminals provides an enable value at any given time;
a plurality of interconnect lines programmably coupling the programmable logic circuits to each other; and
a first group of two or more memory cells, each memory cell having at least one initialization input terminal and further having an output terminal coupled to a control terminal of the at least one programmable circuit, each memory cell in the first group driving an initialization input terminal of each other memory cell in the first group.

22. The system of claim 21, wherein for each memory cell in the first group of memory cells:
the output terminal of the memory cell is an enable terminal having an active high enable value; and
the initialization input terminal of the memory cell is a reset terminal that forces a value stored in the memory cell to a low disable value.

23. The system of claim 21, wherein for each memory cell in the first group of memory cells:

the output terminal of the memory cell is an enable terminal having an active low enable value; and the initialization input terminal of the memory cell is a set terminal that forces a value stored in the memory cell to a high disable value.

24. The system of claim 21, wherein the system comprises a programmable logic device (PLD).

25. The system of claim 24, wherein the PLD is a field programmable gate array (FPGA) and the at least one programmable circuit comprises a configurable logic block (CLB).

26. The system of claim 21, wherein at least another of the programmable logic circuits has a plurality of control terminals wherein at most one of the control terminals provides an enable value at any given time, the system further comprising:

a second group of two or more memory cells, each memory cell having at least one initialization input terminal and further having an output terminal coupled to a control terminal of the another programmable circuit, each memory cell in the second group driving an initialization input terminal of each other memory cell in the second group.

27. A system having reduced susceptibility to single event upsets, the system comprising:

a plurality of programmable logic circuits;

an interconnect structure programmably coupling the programmable logic circuits to each other, the interconnect structure comprising a plurality of interconnect circuits, at least one of the interconnect circuits having a plurality of control terminals wherein at most one of the control terminals provides at enable value at any given time; and a first group of two or more memory cells, each memory cell having at least one initialization input terminal and further having an output terminal coupled to a control terminal of the at least one interconnect circuit, each memory cell in the first group driving an initialization input terminal of each other memory cell in the first group.

28. The system of claim 27, wherein for each memory cell in the first group of memory cells:

the output terminal of the memory cell is an enable terminal having an active high enable value; and the initialization input terminal of the memory cell is a reset terminal that forces a value stored in the memory cell to a low disable value.

29. The system of claim 27, wherein for each memory cell in the first group of memory cells:

the output terminal of the memory cell is an enable terminal having an active low enable value; and the initialization input terminal of the memory cell is a set terminal that forces a value stored in the memory cell to a high disable value.

30. The system of claim 27, wherein the system comprises a programmable logic device (PLD).

31. The system of claim 30, wherein the PLD is a field programmable gate array (FPGA).

32. The system of claim 27, wherein at least another of the interconnect circuits has a plurality of control terminals wherein at most one of the control terminals provides an enable value at any given time, the system further comprising:

a second group of two or more memory cells, each memory cell having at least one initialization input terminal and further having an output terminal coupled to a control terminal of the another interconnect circuit, each memory cell in the second group driving an initialization input terminal of each other memory cell in the second group.

* * * * *